United States Patent [19]

Steele et al.

[11] Patent Number: 4,912,345
[45] Date of Patent: Mar. 27, 1990

[54] PROGRAMMABLE SUMMING FUNCTIONS FOR PROGRAMMABLE LOGIC DEVICES

[75] Inventors: Randy C. Steele; Safoin A. Raad, both of Scottsdale, Ariz.

[73] Assignee: SGS-Thomson Microelectronics, Inc., Carrollton, Tex.

[21] Appl. No.: 291,711

[22] Filed: Dec. 29, 1988

[51] Int. Cl.⁴ .................. H03K 19/173; H03K 19/094
[52] U.S. Cl. ..................................... 307/465; 307/468; 307/471
[58] Field of Search ............... 307/443, 448, 451, 471, 307/465, 468–469

[56] References Cited

U.S. PATENT DOCUMENTS

| | | | |
|---|---|---|---|
| 4,558,236 | 12/1985 | Burrows | 307/465 |
| 4,609,838 | 9/1986 | Huang | 307/471 |
| 4,612,459 | 9/1986 | Pollachek | 307/471 |

Primary Examiner—Stanley D. Miller
Assistant Examiner—Margaret Rose Wambach
Attorney, Agent, or Firm—Richard K. Robinson; Kenneth C. Hill

[57] ABSTRACT

A programmable logic device includes a programmable logic array and an output logic macrocell. The output logic macrocell includes a user configurable summing function that has a first logic gate connected to receive a first plurality of product terms, a second logic gate connected to receive a second plurality of product terms and a third logic gate connected to receive the combination of the first plurality of product terms and a controls signal, a fourth logic gate connected to receive the combination of the second plurality of Product Terms and the control signal and a logic circuit connected to receive the output signals from the first, second, third and fourth logic gates and to provide a first logical combination when the control signal is at a first logic state and a second logical combination when the controls signal is at a second logic state.

11 Claims, 5 Drawing Sheets

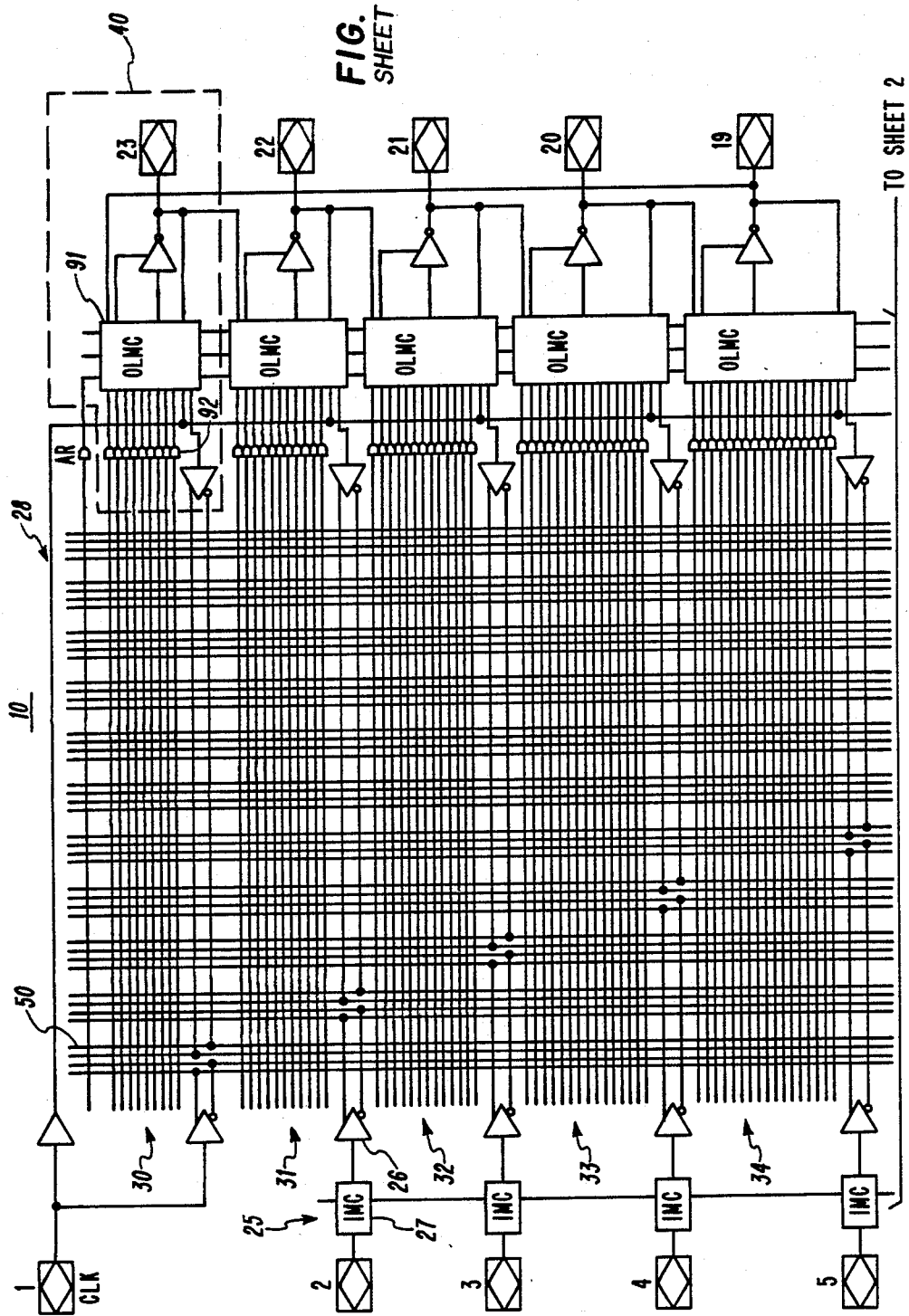

SHEET 2

PROGRAMMABLE SUMMING FUNCTIONS FOR PROGRAMMABLE LOGIC DEVICES

BACKGROUND OF THE INVENTION

This invention relates to programmable logic devices and in particular to programmable logic devices containing a summing function and still more particular to programmable logic devices in which the summing function may be user configurable.

Programmable logic devices are user configurable integrated circuits. These devices contain a set of undedicated inputs, a set of undedicated outputs and a programmable array which permits the logic connection of these inputs to a given output. The most common implementation of this logic connection is a sum of products using an OR summing function, that is, with inputs A,B,C, and D, an output takes the form of; OUT=(A*B)+(C*D) where the terms (A*B) and (C*D) are called product terms. These product terms are generated from the programmable array and may include any of the inputs, or their complements, in each AND function. The logical representation of the sum-of-products with an OR summing function is exemplified by a device called AMPAL20R4 manufactured by Advanced Micro Devices of Sunnyvale, CA and illustrated on page 4-130 of the "Programmable Logic Handbook/Data Book" which was copyrighted in 1986 by Advanced Micro Devices, Inc.

A less common, but very powerful, approach to the summing function is the exclusive OR (XOR) implementation. The logical representation of this configuration is illustrated on page 4-170 of the above referenced handbook. The XOR sum can implement certain logical functions, such as counters, comparators, parity generators-checkers, more efficiently than the standard OR sum function.

SUMMARY OF THE INVENTION

A programmable logic device includes a programmable logic array and an output logic macrocell. The output logic macrocell includes a user configurable summing function that has a first logic gate connected to receive a first plurality of product terms, a second logic gate connected to receive a second plurality of product terms and a third logic gate connected to receive the combination of the first plurality of product terms and a control signal. A fourth logic gate is connected to receive the combination of the second plurality of product terms and the control signal and a logic circuit is connected to receive the output signals from the first, second, third and fourth logic gates and to provide a first output signal when the control signal is at a first logic state and a second output signal when the control signal is at a second logic state.

In one embodiment the first and second logic gates are OR gates and the third and fourth logic gates are NAND gates, the logic circuit is a CMOS exclusive OR gate and consequently when the control signal is a logic 0 the output signal is the OR combination of the logical OR of the first plurality of product terms with the logical OR of the second plurality of product terms. When the control signal is at a logic 1 then the output signal is the exclusive OR combination of the logical OR of the first plurality of products terms with the logical OR of the second plurality of product terms.

In an alternate embodiment the first and second logic gates are NOR gates with each NOR gate connected to receive a plurality of product terms, the third and fourth logic gates are additionally NOR gates and the logic circuit is an exclusive Field Effect Transistor OR circuit. In this embodiment when the control signal is at a logic 1 an OR summing function is performed and when the control signal is at a logic 0 an exclusive OR summing function is performed.

These and other advantages and features will be more apparent from a reading of the specification in combination with the figures in which:

DETAILED DESCRIPTION OF THE EMBODIMENTS

Figure 1:
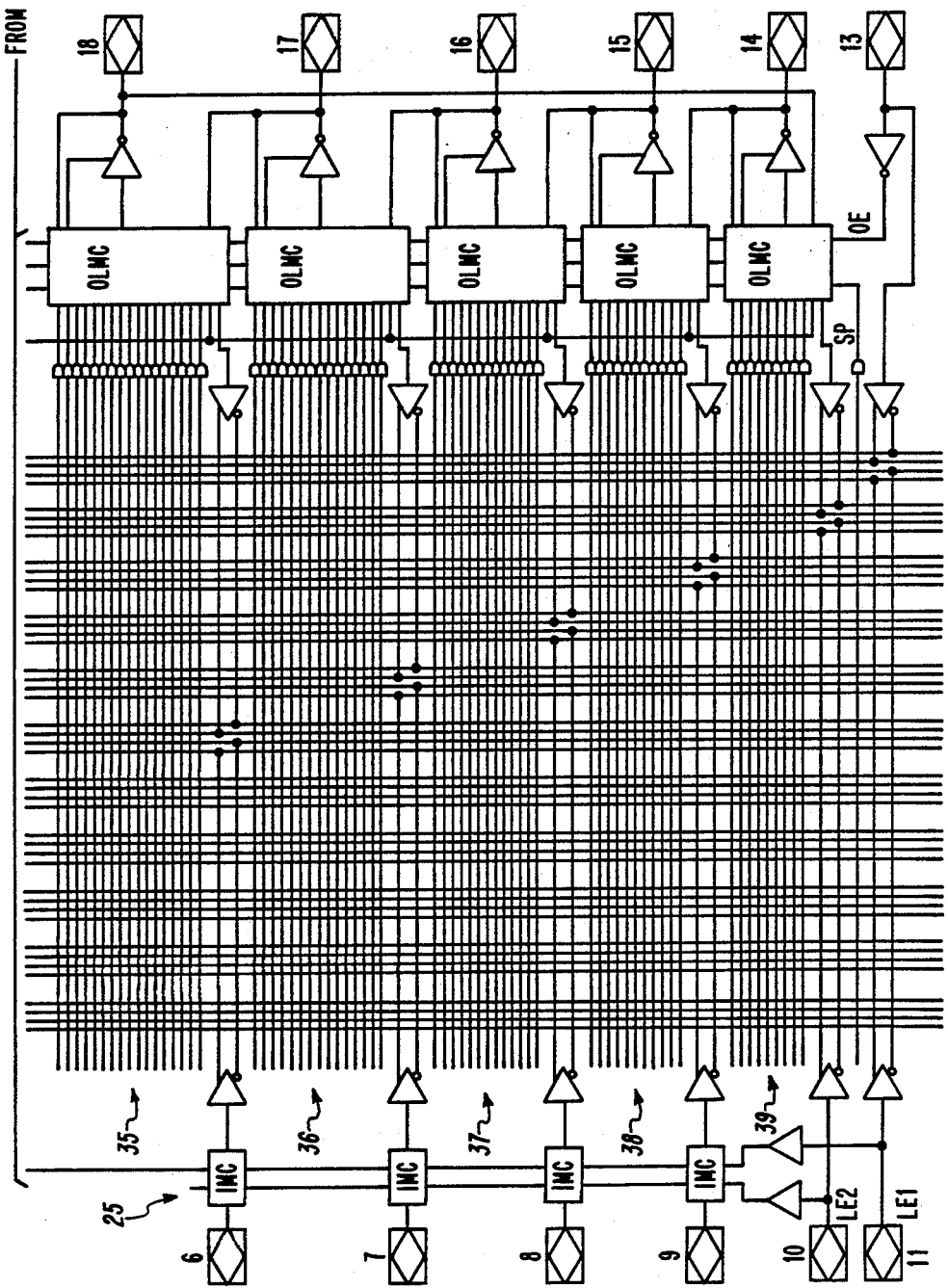
FIG. 1 is a schematic diagram of a programmable logic device according to the invention.

In FIG. 1, to which reference should now be made, there is shown a programmable logic device 10. The programmable logic device includes the input circuits 25 which includes a terminal, an input macrocell (IMC) and a driver amplifier 26. The input macrocell 27 typically includes an input latch for latching the input data. The input date is then used to address the memory array 28, which in the embodiment of FIG. 1 is an electrically erasable CMOS programmable array or EECMOS.

The memory array 28 is arranged, for illustration purposes only, into sub arrays 30–39 with each sub-array having an output circuit 40 that includes an output logic macrocell 41 and a plurality of sense amplifiers 42 which are connected to the rows of each sub-array.

The sense amplifiers 42 are connected to sense the product terms whose logic states are dependent upon the input states and the connecting switches between the row lines 50 and the product terms. The output circuit 40 also includes an output logic macrocell of which a schematic diagram is provided in FIG. 2 to which reference should now be made.

Figure 2:
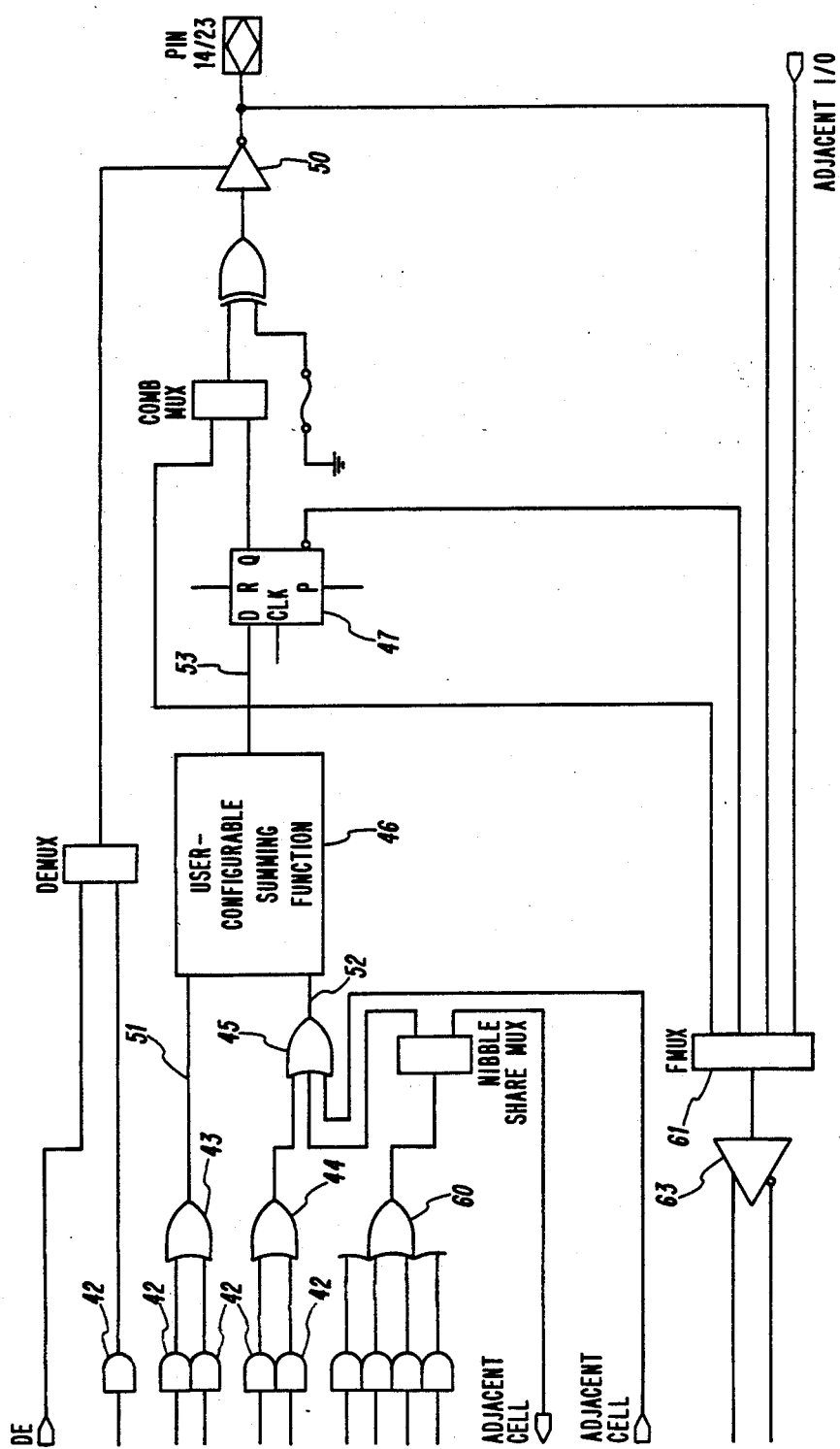
FIG. 2 is a schematic diagram of an output logic macrocell of FIG. 1.

In FIG. 2 sense amplifier outputs are brought into OR gates 43, 44, or 60. The output of OR gates 44 and 60 are combined by OR gate 45 and applied to the user configurable summing function 46 via conductor 52 and the output of OR gate 43 is applied to the user configurable summing function 46 via conductor 51. Depending upon the configuration that will be discussed in conjunction with FIGS. 3 and 4, the output of the user configurable summing function is applied either directly to the combining mux or to an output latch 47 which in the embodiment of FIG. 2 is a D type flip flop but may be an RS flip flop, J-K flip flop or a toggle flip flop depending upon the configuration. The output is buffered by the exclusive OR gate 51 and an inverter 50 to provide the output of the combined product terms on pin 14/23. The combined product terms may be multiplexed back into the memory array via the feedback multiplexer 61 and line driver 63.

Figure 3:
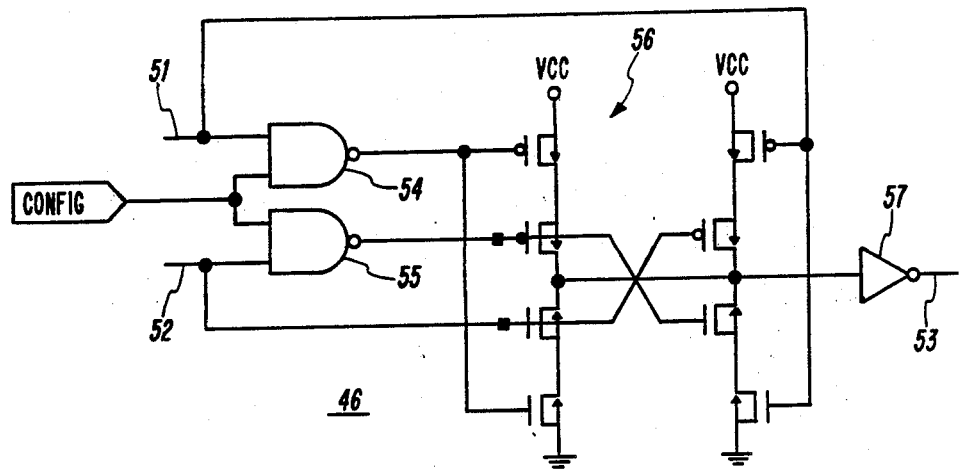
FIG. 3 is a schematic diagram of a user configurable summing function circuit of FIG. 2.

FIG. 3 to which reference should now be made, is a schematic diagram of the user configurable summing function 46 and includes NAND gates 54 and 55. NAND gate 54 is connected to conductor 51 and to receive a control signal noted as Config. NAND gate 55 is connected to conductor 52 and connected to receive the control signal, Config. The outputs of NAND gates 54 and 55 are connected to a CMOS exclusive NOR circuit 56 which performs either a NOR or an exclusive NOR on the signals which are present on conductors 51 and 52. Config. determines which of these functions is provided. When Config. is at a logical 0 an OR summing function is performed by the user configurable summing function 46 as shown in FIG. 3 and when Config. is at a logic 1 then the user configurable summing function 46 of FIG. 3 produces an exclusive OR summing function. The output of the exclusive NOR circuit 56 is applied to an inverter 57 which is connected to conductor 53.

Figure 4:
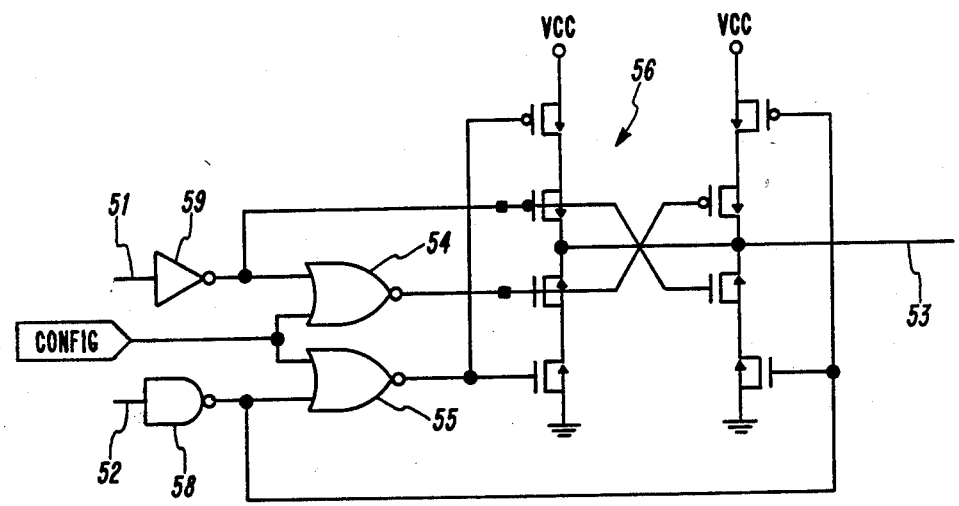
FIG. 4 is a schematic diagram of an alternate embodiment of the user configurable summing function of FIG. 2.

An alternate embodiment to the embodiment of FIG. 3 is the embodiment of FIG. 4 which is the DeMorgan reduction of the embodiment of FIG. 3 and requires that the OR gates 42 and 45 of FIG. 2 be converted to NOR gates. For schematic purposes this is illustrated by inverters 59 and 58 which are connected to conductors 51 and 52 respectively. The outputs of the inverters are applied to NOR gates 54 and 55. NOR gate 54 performs a logical NOR of the control signal, Config. and the logical NOR from NOR gate 43 where as NOR gate 55 performs a logic NOR combination on the Config. signal and the logical NOR output from NOR gate 45.

Exclusive OR circuit 56 performs either an OR or exclusive OR of the outputs of inverters 58 and 59 for output onto conductor 53. Config. determines which of these functions is provided. When Config. is at a logical 1 an OR summing function is performed by the user configurable summing function 46 is shown in FIG. 4 and when Config. is at a logic 0 then the user configurable summing function 46 of FIG. 4 produces an exclusive OR summing function.

Figure 5:
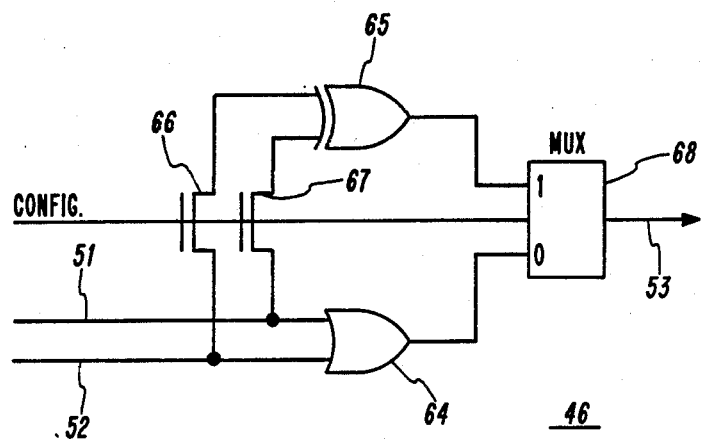
FIG. 5 is a schematic diagram of a further alternate embodiment of the user configurable summing function of FIG. 2.

A further alternate embodiment of FIG. 3 is the embodiment of FIG. 5. In this embodiment, conductors 51 and 52 are applied to OR gate 64 directly, while these same conductors are applied to exclusive OR gate 65 through switching transistors 67 and 55 respectively. The outputs of OR gate 64 and exclusive OR gate 65 are multiplexed onto conductor 53 through mix 68. Switching transistors 66 and 67 and mux 68 are all controlled by the Config. signal. When Config. is at a logical 0 then switching transistors 66 and 67 are off and the mux connects the output of OR gate 64 to conductor 53. In this state the user configurable summing function performs the logical OR of the signals present on conductors 51 and 52. When Config. is at a logical 1 then switching transistor 66 and 67 are on, and the mux 68 connects the output of exclusive OR gate 65 to conductor 53. In this state the user configurable summing function 46 performs the logical exclusive OR of the signals present on conductors 51 and 52. The embodiment of FIG. 5 is advantageous in applications where the propagation delay of the OR function needs to minimized. When Config. is at a logic 0 switching transistors 66 and 67 are off and the load and delay of the exclusive OR gate 65 is not applied to conductors 51 and 52.

Accordingly I claim the following:

1. A programmable summing function for a programmable logic device comprising:
    a first logic gate connected to receive a first plurality of input signals;
    a second logic gate connected to receive a second plurality of input signals;
    a first NAND gate connected to receive the output of the first logic gate and a control signal;
    a second NAND gate connected to receive the output of the second logic gate and the control signal; and
    a logic circuit connected to receive outputs from the first and second logic gates and the first and second NAND gates, to provide an output signal for a first logical combination when the control signal is at a first logic state and a second logical combination when the control signal is at a second logic state.

2. The programmable summing function for a programmable logic device according to claim 1 wherein the first and second logic gates each comprise an OR gate.

3. The programmable summing function for programmable logic devices according to claim 2 wherein the first logic state is a logic one and the first logical combination is an OR combination of a summation of the first plurality of input signals and a summation of the second plurality of input signals.

4. The programmable summing function for programmable logic devices according to claim 2 wherein the first logic state is a logic 0 and the first logical combination is an exclusive OR combination of a summation of the first plurality of input signals and a summation of the second plurality of input signals.

5. A programmable summing function for a programmable logic device comprising:
    a first NOR gate connected to receive a first plurality of input signals;
    a second NOR gate connected to receive a second plurality of input signals;
    a third NOR gate connected to receive the output of the first logic NOR gate and a control signal;
    a fourth NOR gate connected to receive the output of the second logic gate and the control signal; and
    a logic circuit connected to receive outputs from the first, second, third, and fourth NOR gates and to provide an output signal of a first logical combination when the control signal is at a first logic state and a second logical combination when the control signal is at a second logic state.

6. The programmable summing function for programmable logic devices according to claim 5 wherein the first logic state is logic 1 and the first logical combination is an exclusive OR combination of a summation of the first plurality of input signals and a summation of the second plurality of input signals.

7. A programmable summing function for a programmable logic device comprising;
    a first logic gate means for providing a first summation of a first plurality of input signals;
    a second logic gate means for providing a second summation of a second plurality of input signals;
    a first NAND gate for logically combining the first summation with a control signal and to provide a third summation;
    a second NAND gate for logically combining the second summation and the control signals and to provide a fourth summation; and
    a logic circuit means for combining in a first logic manner the first, second, third and fourth summation when the control signal is at a first logic state and in a second logic manner when the control signal is at a second logic state.

8. The programmable summing function for programmable logic devices according to claim 7 wherein the first logic gate means and second logic gate means each comprise an OR gate.

9. The programmable summing function for programmable logic devices according to claim 7 wherein the first logical combination is an OR combination.

10. The programmable summing function for programmable logic devices according to claim 7 wherein the logical combination is an exclusive OR combination.

11. A programmable summing function for a programmable logic device comprising;

a first logic gate means for providing a first summation of a first plurality of input signals;

a second logic gate means for providing a second summation of a second plurality of input signals;

a fist NOR gate for logically combining the first summation with a control signal and to provide a third summation;

a second NOR gate for logically combining the second summation and the control signals and to provide a fourth summation; and a logic circuit means for combining in a first logic manner the first, second, third and fourth summation when the control signal is at a first logic state and a second logical combination when the control signal is at a second logic state.

* * * * *